(12) United States Patent
Selvamanickam

(10) Patent No.: US 6,998,028 B1
(45) Date of Patent: Feb. 14, 2006

(54) METHODS FOR FORMING SUPERCONDUCTING CONDUCTORS

(75) Inventor: Venkat Selvamanickam, Wynantskill, NY (US)

(73) Assignee: Superpower, Inc., Schenectady, NY (US)

( * ) Notice: Subject to any disclaimer, the term of this patent is extended or adjusted under 35 U.S.C. 154(b) by 0 days.

(21) Appl. No.: 10/949,996

(22) Filed: Sep. 24, 2004

(51) Int. Cl.
*C23C 14/34* (2006.01)
*B05D 5/12* (2006.01)

(52) U.S. Cl. ............... 204/192.11; 204/192.12; 427/62; 427/402; 427/419.3

(58) Field of Classification Search .......... 204/192.12, 204/192.11; 427/62, 419.3, 402; 505/470
See application file for complete search history.

(56) References Cited

U.S. PATENT DOCUMENTS 5,196,399 A * 3/1993 Shiota et al. ............. 65/443

OTHER PUBLICATIONS

Vossen et al., "Thin Film Processes", p. 48-49 (1978).*
S. Gnanarajan, et al., "YBCO/YSZ/HASTELLOY Superconducting Tapes by IBAD Magnetron Deposition", The American Ceramic Society, vol. 140, pp. 211-218, 2002.
A. Malozemoff, et al., "Scale-Up of Second Generation HTS Wire (2G-YBCO Coated Conductor)", American Superconductor Corporation, DOE Peer Review, Jul. 2004, pp. 1-62.

* cited by examiner

*Primary Examiner*—Steven Versteeg
(74) *Attorney, Agent, or Firm*—Toler, Larson & Abel, LLP

(57) ABSTRACT

A method for producing a superconducting conductor is disclosed, including providing a substrate, depositing a buffer film having a biaxial texture to overlie the substrate by reactive sputtering, and depositing a superconducting layer to overlie the buffer film. Deposition of the buffer film is carried out by exposing the substrate along a deposition zone to a material plume generated by bombarding a target in the presence of a magnetic field, the deposition zone having a length of at least 1.0 m. The assist ions may be generated from a gridless ion source. The buffer film may have a biaxial texture having an out-of-plane crystallographic texture represented by a mosaic spread of not greater than 30°.

24 Claims, 2 Drawing Sheets

METHODS FOR FORMING SUPERCONDUCTING CONDUCTORS

CROSS-REFERENCE TO RELATED APPLICATION(S)

BACKGROUND

1. Field of the Invention

The present invention is generally directed to techniques for forming superconductors, and particularly superconducting conductors, the conductors formed thereby, and components incorporating such conductors.

2. Description of the Related Art

Superconductor materials have long been known and understood by the technical community. Low-temperature (low-$T_c$) superconductors exhibiting superconductive properties at temperatures requiring use of liquid helium (4.2 K), have been known since about 1911. However, it was not until somewhat recently that oxide-based high-temperature (high-$T_c$) superconductors have been discovered. Around 1986, a first high-temperature superconductor (HTS), having superconductive properties at a temperature above that of liquid nitrogen (77 K) was discovered, namely $YBa_2Cu_3O_{7-x}$ (YBCO), followed by development of additional materials over the past 15 years including $Bi_2Sr_2Ca_2Cu_3O_{10+y}$ (BSCCO), and others. The development of high-$T_c$ superconductors has brought potential, economically feasible development of superconductor components incorporating such materials, due partly to the cost of operating such superconductors with liquid nitrogen rather than the comparatively more expensive cryogenic infrastructure based on liquid helium.

Of the myriad of potential applications, the industry has sought to develop use of such materials in the power industry, including applications for power generation, transmission, distribution, and storage. In this regard, it is estimated that the inherent resistance of copper-based commercial power components is responsible for quite significant losses in electricity, and accordingly, the power industry stands to gain significant efficiencies based upon utilization of high-temperature superconductors in power components such as transmission and distribution power cables, generators, transformers, and fault current interrupters. In addition, other benefits of high-temperature superconductors in the power industry include an increase in one to two orders of magnitude of power-handling capacity, significant reduction in the size (i.e., footprint) of electric power equipment, reduced environmental impact, greater safety, and increased capacity over conventional technology. While such potential benefits of high-temperature superconductors remain quite compelling, numerous technical challenges continue to exist in the production and commercialization of high-temperature superconductors on a large scale.

Among the many challenges associated with the commercialization of high-temperature superconductors, many exist around the fabrication of a superconducting tape that can be utilized for formation of various power components. A first generation of superconducting tape includes use of the above-mentioned BSCCO high-temperature superconductor. This material is generally provided in the form of discrete filaments, which are embedded in a matrix of noble metal, typically silver. Although such conductors may be made in extended lengths needed for implementation into the power industry (such as on the order of hundreds of meters), due to materials and manufacturing costs, such tapes do not represent a commercially feasible product.

Accordingly, a great deal of interest has been generated in the so-called second-generation HTS tapes that have superior commercial viability. These tapes typically rely on a layered structure, generally including a flexible substrate that provides mechanical support, at least one buffer layer overlying the substrate, the buffer layer optionally containing multiple films, an HTS layer overlying the buffer film, and an electrical stabilizer layer overlying the superconductor layer, typically formed of at least a noble metal. However, to date, numerous engineering and manufacturing challenges remain prior to full commercialization of such second generation-tapes.

Accordingly, in view of the foregoing, various needs continue to exist in the art of superconductors, and in particular, provision of commercially viable superconducting tapes, methods for forming same, and power components utilizing such superconducting tapes. In addition, there is a particularly acute need for production technologies and methods for forming superconducting components in a high throughput, scalable manner.

SUMMARY

According to one embodiment, a method for producing a superconducting conductor is provided, including providing substrate, depositing a buffer film to overlie the substrate by reactive sputtering utilizing an ion assist, the buffer film having a biaxial texture, and depositing a superconductor layer to overlie the buffer film.

According to another aspect, a method for producing a superconducting conductor is provided, including providing substrate, depositing a buffer film to overlie the substrate by exposing the substrate extending along a deposition zone to a material plume from a target, the deposition zone having a length of at least 1.0 m, and the buffer film having a biaxial texture, and depositing a superconductor layer to overlie the buffer film.

According to another aspect, a method for producing a superconducting conductor is provided, including providing a substrate and depositing a buffer layer to overlie the substrate by exposing the substrate along a deposition zone to a material plume generated by reactive sputtering. Generally, the deposition zone has a length of at least 1.0 m, and the buffer film has a biaxial texture. The method further calls for exposing the substrate to a beam of assist ions generated from a gridless ion source during depositing, such that the buffer film has a biaxial texture having an out-of-plane crystallographic texture represented by a mosaic spread of not greater than 30°, and further, depositing a superconductor layer to overlie the buffer film.

DESCRIPTION OF THE PREFERRED EMBODIMENT(S)

For the purposes of promoting an understanding of the invention, reference will now be made to embodiments of the present invention as illustrated in FIGS. 1–4 and specific language used to describe the same. The terminology used herein is for the purpose of description, not limitation. Specific structural and functional details disclosed herein are not to be interpreted as limiting, but merely as a basis for the claims as a representative basis for teaching one skilled in the art to variously employ aspect of the present invention. Any modifications or variations in the depicted structures and methods of making same, and such further applications of the principles of the invention as illustrated herein, as would normally occur to one skilled in the art, are considered to be within the scope of this invention.

Figure 1:
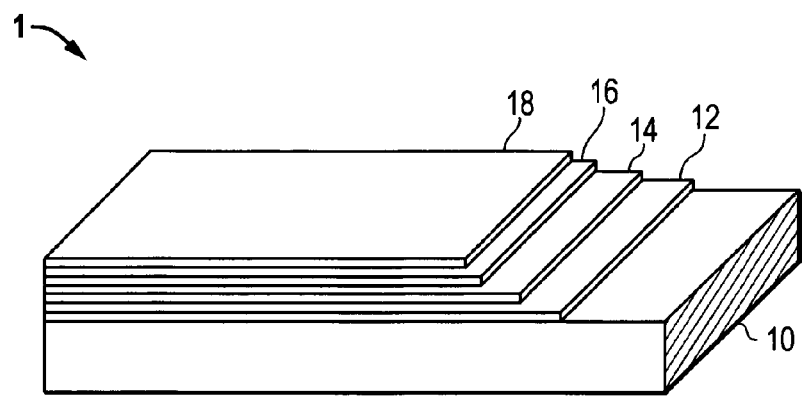
FIG. 1 illustrates a partial cross-section depiction of a portion of a superconducting conductor according to an embodiment of the present invention.

Turning to FIG. 1, the general layered structure of a superconductive article according to an embodiment of the present invention is depicted. The superconductive article 1 includes a substrate 10, a buffer layer 12 overlying the substrate 10, a superconductor layer 14, followed by a capping layer 16 (optional), typically a noble metal layer, and a stabilizer layer 18 (optional), typically a non-noble metal.

The substrate 10 is generally metal-based, and typically, an alloy of at least two metallic elements. Particularly suitable substrate materials include nickel-based metal alloys such as the known Inconel® (group of alloys. The Inconel® alloys tend to have desirable creep, chemical and mechanical properties, including coefficient of expansion, tensile strength, yield strength, and elongation. These metals are generally commercially available in the form of spooled tapes, particularly suitable for superconductor tape fabrication, which typically will utilize reel-to-reel tape handling.

The substrate 10 is typically in a tape-like configuration, having a high dimension ratio. For example, the width of the tape is generally on the order of about 0.4–10 cm, and the length of the tape is typically at least about 100 m, most typically greater than about 500 m. Indeed, embodiments of the present invention provide for superconducting tapes that include substrate 10 having a length on the order of 1 km or above. Accordingly, the substrate may have a dimension ratio which is fairly high, on the order of not less than 10, not less than about $10^2$, or even not less than about $10^3$. Certain embodiments are longer, having a dimension ratio of $10^4$ and higher. As used herein, the term 'dimension ratio' is used to denote the ratio of the length of the substrate or tape to the next longest dimension, the width of the substrate or tape.

In one embodiment, the substrate is treated so as to have desirable surface properties for subsequent deposition of the constituent layers of the superconductor tape. For example, the surface may be lightly polished to a desired flatness and surface roughness. Following polishing, the substrate is also typically cleaned (e.g., ultrasonic cleaning), followed by annealing, and ion treating. Techniques for treating the substrate are found in co-pending U.S. Ser. No. 10/816,045 filed Apr. 1, 2004, incorporated herein by reference.

Although the substrate may be surface treated, according to a particular feature of one embodiment, the substrate is non-textured, that is, has no particular crystallographic orientation such as with RABiT (rolling-assisted biaxially textured) substrates. Non textured substrates include amorphous and polycrystalline substrates having random crystallography (i.e., generally free of crystallographic alignment), but typically the latter polycrystalline substrates are used.

Turning to the buffer layer 12, the buffer layer may be a single layer, or more commonly, be made up of several films. Most typically, the buffer layer includes a biaxially textured film, having a crystalline texture that is generally aligned along crystal axes both in-plane and out-of-plane of the film. Such biaxial texturing may be accomplished by ion beam assisted deposition (IBAD). A more detailed discussion of deposition of the buffer layer is provided below, according to particular aspects of the present invention. The buffer film may have a thickness on the order or 50 to 500 Angstroms, such as 50 to 200 Angstroms. Generally, the buffer film has a rock-salt like crystal structure, as defined and described in U.S. Pat. No. 6,190,752, incorporated herein by reference. Suitable materials include MgO, NiO, YSZ, $CeO_2$, $Y_2O_3$, $TiO_2$, $SnO_2$, $Mn_3O_4$, $Fe_3O_4$, $Cu_2O$, and $RE_2O_3$ (where RE=a rare earth element).

The buffer layer may include additional films, such as a barrier film provided to directly contact and be placed in between a buffer film and the substrate. In this regard, the barrier film may advantageously be formed of an oxide, such as yttria, and functions to isolate the substrate from the buffer film. A barrier film may also be formed of non-oxides such as silicon nitride. Suitable techniques for deposition of a barrier film include chemical vapor deposition and physical vapor deposition including sputtering. Typical thicknesses of the barrier film may be within a range of about 100–1000 Angstroms. Still further, the buffer layer may also include an epitaxially grown film, formed over the buffer film. In this context, the epitaxially grown film is effective to increase the thickness of the buffer film formed through the IBAD processing route, and may desirably be made principally of the same material utilized for the IBAD film such as MgO.

In embodiments utilizing an MgO-based IBAD film and/or epitaxial film, a lattice mismatch between the MgO material and the material of the superconductor layer generally exists. Accordingly, the buffer layer may further include another buffer film, this one in particular implemented to reduce a mismatch in lattice constants between the superconductor layer and the underlying IBAD film and/or epitaxial film. This buffer film may be formed of materials such as YSZ (yttria-stabilized zirconia) strontium ruthenate, lanthanum manganate, and generally, perovskite-structured ceramic materials. The buffer film may be deposited by various physical vapor deposition techniques.

The superconductor layer 14 is generally in the form of a high-temperature superconductor (HTS) layer. HTS materials are typically chosen from any of the high-temperature superconducting materials that exhibit superconducting properties above the temperature of liquid nitrogen, 77K. Such materials may include, for example, $YBa_2Cu_3O_{7-x}$, $Bi_2Sr_2Ca_2Cu_3O_{10+y}$, $Tl_2Ba_2Ca_2Cu_3O_{10+y}$, and $HgBa_2Ca_2Cu_3O_{8+y}$. One class of materials includes $REBa_2Cu_3O_{7-x}$, wherein RE is a rare earth element. Of the foregoing, $YBa_2Cu_3O_{7-x}$, also generally referred to as YBCO, may be advantageously utilized. The superconductor layer 14 may be formed by any one of various techniques, including thick and thin film forming techniques. Preferably, a thin film physical vapor deposition technique such as pulsed laser deposition (PLD) can be used for a high deposition rates, or a chemical vapor deposition technique can be used for lower cost and larger surface area treatment. Typically, the superconductor layer has a thickness on the order of about 1 to about 30 microns, most typically about 2 to about 20 microns, such as about 2 to about 10 microns, in order to get desirable amperage ratings associated with the superconductor layer 14.

The capping layer 16 and the stabilizer layer 18 are generally implemented for electrical stabilization to aid in prevention of superconductor burnout in practical use. More particularly, layers 16 and 18 aid in continued flow of electrical charges along the superconductor in cases where cooling fails or the critical current density is exceeded, and the superconductor layer moves from the superconducting state and becomes resistive. Typically, a noble metal is utilized for capping layer 16 to prevent unwanted interaction between the stabilizer layer(s) and the superconductor layer 14. Typical noble metals include gold, silver, platinum, and palladium. Silver is typically used due to its cost and general accessibility. The capping layer 16 is typically made to be thick enough to prevent unwanted diffusion of the components from the stabilizer layer 18 into the superconductor layer 14, but is made to be generally thin for cost reasons (raw material and processing costs). Typical thicknesses of the capping layer 16 range within about 0.1 to about 10.0 microns, such as 0.5 to about 5.0 microns. Various techniques may be used for deposition of the capping layer 16, including physical vapor deposition, such as DC magnetron sputtering.

The stabilizer layer 18 is generally incorporated to overlie the superconductor layer 14, and in particular, overlie and directly contact the capping layer 16 in the particular embodiment shown in FIG. 1. The stabilizer layer 18 functions as a protection/shunt layer to enhance stability against harsh environmental conditions and superconductivity quench. The layer is generally dense and thermally and electrically conductive, and functions to bypass electrical current in case of failure of the superconducting layer. It may be formed by any one of various thick and thin film forming techniques, such as by laminating a pre-formed copper strip onto the superconducting tape, by using an intermediary bonding material such as a solder or flux. Other techniques have focused on physical vapor deposition, typically, sputtering, electroless plating, and electroplating. In this regard, the capping layer 16 may function as a seed layer for deposition of copper thereon.

An embodiment of the present invention describes a process for deposition of biaxially-textured buffer film(s) forming or partly forming the buffer layer for second-generation high temperature superconducting tapes having a high critical current density. By way of background to aid in understanding aspects of the present invention, texture of the buffer film is directly related to the superconducting properties of the conductor. In this regard, as used herein, the critical current density refers to a measurement of current carrying capacity, and is abbreviated $J_c$, measured in amperes/square centimeter ($A/cm^2$ at 0 T and 77K). The critical current density in superconducting oxide films is partly dependent upon grain-to-grain misalignments in the films. Higher $J_c$ values are associated with smaller misalignment angles. In order to create low-angle grain boundaries in the superconducting material, a biaxial texture is established, first in the buffer film, which is retained through epitaxial growth of the superconductor layer. Accordingly, establishment of a well textured buffer film is generally important.

The degree of biaxial texture can be described by specifying the distribution of grains in-plane and out-of-plane orientations as determined by x-ray diffraction. Actual quantification of the grain to grain misalignment is generally represented by the full-width-half-maximum (FWHM) of the rocking curve (x-ray diffraction peak) of the out-of-plane ($\Delta\omega$) and in-plane ($\Delta\phi$) reflections. Therefore, the degree of biaxial texture can be defined by specifying the range of $\Delta\omega$ and $\Delta\phi$ for a given sample, also referred to as 'mosaic spread.' Out of plane ($\Delta\omega$) values are typically from the (001) pole figure measurement. According to embodiments of the present invention, the biaxially-textured film generally has both $\Delta\omega$ and $\Delta\phi$ (mosaic spreads) less than about 30°, such as less than about 20°, 15°, 10°, or 5°, but often times greater than about 1°.

According to an embodiment, ion beam assisted deposition is utilized to deposit the biaxially textured buffer film. In this technique, there is/are source(s) providing flux or material plume of atoms or atom clusters that deposit on the substrate tape to form the buffer film to overlie the substrate. As used herein, the term 'overlie' does not require direct contact, but might include intervening intermediate layers. In order to obtain the highly desirable biaxial texture in the buffer film during deposition, an assist ion beam from an assist ion source inside the system is arranged to simultaneously bombard the substrate (more precisely, the material plume and the growing buffer film) during deposition, at a oblique incident angle from substrate normal.

Figure 2:
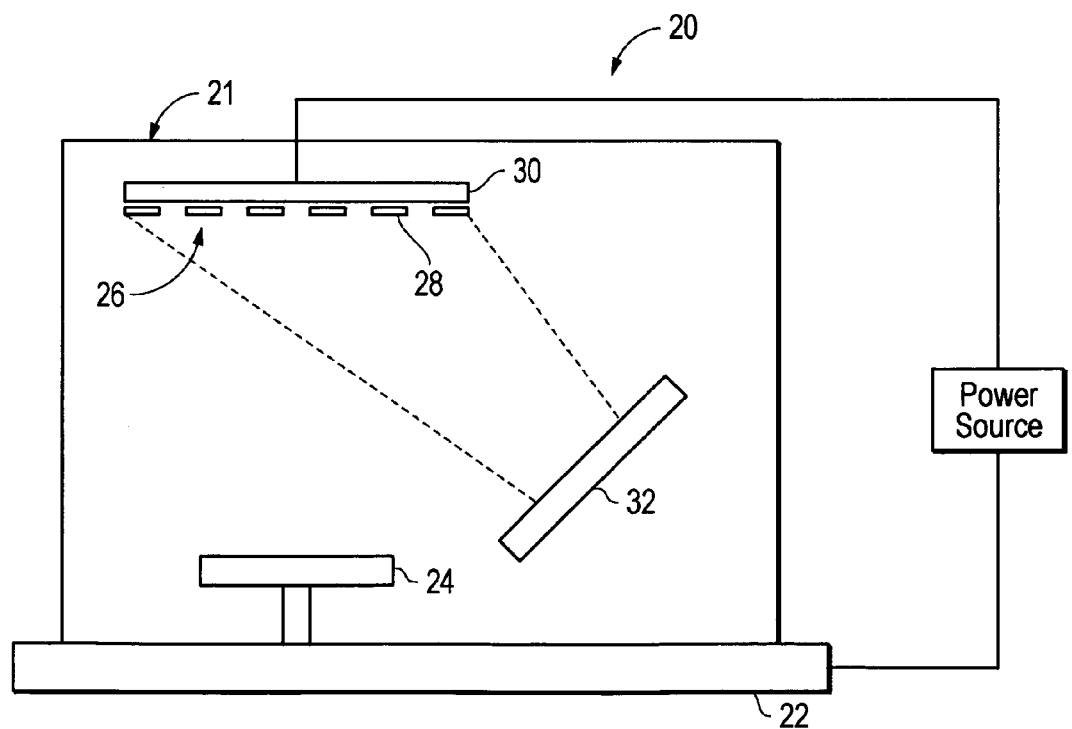
FIG. 2 illustrates the basic structure of an IBAD apparatus according to an embodiment of the present invention.

Turning to additional details relating to the biaxially textured buffer film, attention is drawn to FIG. 2. FIG. 2 is a schematic of an IBAD processing apparatus 20, which includes a vacuum chamber 21 joined to a base 22. The apparatus includes a target 24, generally formed of a metallic element or elements making up the ceramic composition that forms the textured buffer film, such as Y and Zr in the case of YSZ buffer films. However, other metallic elements may be used, generally one of, or optionally a combination of Mg, Ni, Ce, Y, Ti, Sn, Mn, Fe, Cu, and RE (rare earth elements), depending on the intended composition of the buffer film. The target 24 is mounted to a pedestal, and is the source for the raw material forming the material plume throughout substantially the entirety of the vacuum chamber 21, and particularly, between the target 24 and the substrate. Here, the substrate is in the form of a substrate tape 26, which is helically wound so as to make multiple passes in the form of segments 28. In the embodiment shown, the substrate tape 26 forms a helix having six segments, routed so as to pass over substrate block 30. Although not shown, the helix of tape segments 28 are routed into or through the vacuum chamber 21 via a reel-to-reel mechanism. A power source is connected as shown to generate the material plume causing reaction, typically oxidation, of the sputtered material and subsequent deposition of the reacted target material along the segments 28. The power source may be a pulsed DC source to avoid poisoning (oxidation) of the metal targets. In such a case, the power may be pulsed at a rate of 1 to 10 kHz so to minimizing target poisoning.

The substrate block may be in the form of a long metal block having an internal coolant passageway to increase the heat capacity for heat dissipation. The length of the substrate block extends along at least the length of the deposition zone, generally on the order of 0.5 meter to 10 meters or greater, depending upon the size of the IBAD apparatus.

To enable the formation of a well textured film, particularly a film that has biaxial texturing including in-plane and out-of-plane alignment, an ion assist source 32 is provided to generate assist ions that travel through and impact the material plume enabling alignment of the depositing species. According to a particular development of the illustrated embodiment, deposition of the reacted target species is carried out in the presence of a magnetic field, and the ion assist source is formed by a gridless source (discussed in more detail below).

Figure 3:
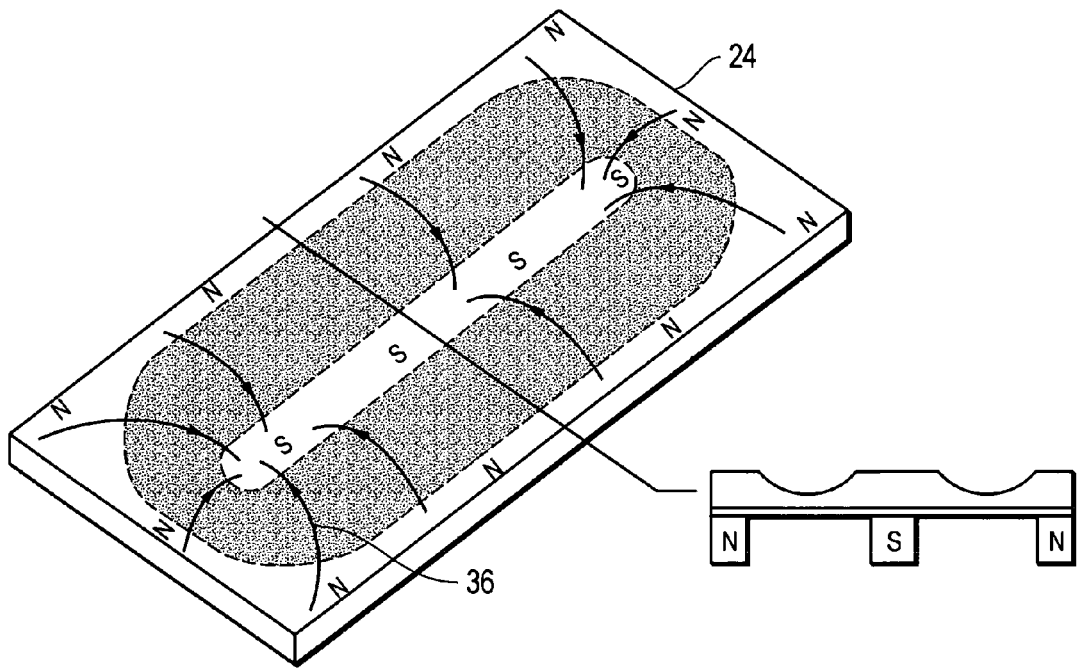
FIGS. 3 and 4 illustrate the configuration of a target utilized in a magnetron sputtering source.
Figure 4:
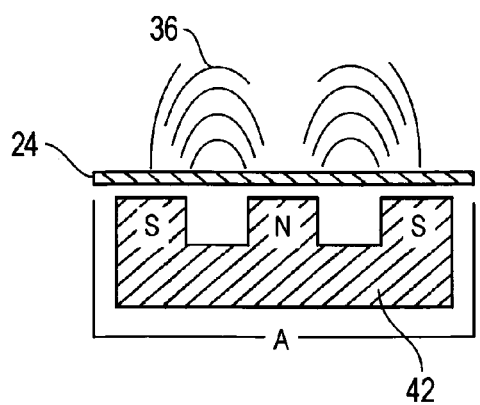

Turning to FIGS. 3 and 4, the structure of the target 24 is more clearly illustrated. As shown, a magnet 42 is provided adjacent to and underlying the target 24, forming a magnetic field represented by field lines 36. The incorporation of a magnetic field source such as the structure illustrated in FIGS. 3 and 4, in the context of sputtering processes is typically referred to as magnetron sputtering. According to a particular feature of the present invention, magnetron sputtering is carried out by application of a DC power source, rather than an RF source, and sputtering is carried out with metal targets, the material from which reacts to form the desired composition of the buffer film.

While magnetron sputtering is generally understood in the context of thin-film processing including semiconductor processing for deposition of various conductive metallic species as well as insulators, the use of magnetron sputtering in the context of IBAD processing for forming superconductor devices is particularly significant. In technologies outside the scope of superconductor processing, typically magnetron sputtering is utilized to take advantage of inherently higher deposition rates, which can be on the order of 10 to 100 times the deposition rate of ion beam sputtering. However, due to reaction kinetics of the material forming the buffer film, it was expected that magnetron sputtering would not be capable of forming high quality, biaxially textured thin films. However, biaxially textured thin films have been recently demonstrated at 40 times higher rate than in conventional IBAD processes. Magnetron sputter sources, and in particular reactive magnetron sputter sources (e.g., generally using metallic rather than dielectric/ceramic targets) can then be advantageously used for high-rate deposition for IBAD processing. The sputter yields of metallic targets are 10 to 100 times higher than those of dielectric/ceramic targets enabling high deposition rates. In addition, according to an aspect of the present invention, reactive magnetron sputtering is employed to enable formation of extended deposition zones, by incorporating extended length targets. More particularly, according to embodiments of the present invention, the target may be generally rectangular as shown in FIGS. 3 and 4, and may have a length or longest dimension greater than about 1 meter, such as greater than about 1.5 or even greater than 2 meters. Indeed, certain embodiments utilize targets on the order of 3 to 6 meters long. A plurality of reactive magnetron sputter sources and gridless ion assist sources may be utilized to provide deposition zones on the order of 10 meters or more, such as up to 30 meters.

Further, not only does the use of a reactive magnetron sputter source enable extended deposition areas and lengths for improved throughput, but also provides for superior thickness uniformity and more precisely controllable deposition rates. A particular form of the reactive magnetron sputter source may be chosen from one of several commercially available sources, such as those available from AJA international, having dimensions on the order of 15 centimeters by 150 centimeters or greater.

Such extended length targets, enabled by reactive magnetron sputtering technology, provides for extended deposition zones along the length of the substrate tape segments, (extending perpendicular to the plane of FIG. 2). Accordingly, by utilizing extended deposition zones, generally corresponding to the length of the target, high throughput processing is enabled, which may be on the order of 2–10 times the throughput associated with conventional ion beam sputtering having 10–60 cm deposition zones. That is, the incorporation of relatively long-length deposition zones enables faster substrate feed speeds and accordingly, higher throughput, which important in producing cost-effective high temperature superconducting (HTS) tapes and enabling widespread adaptation of such materials in the power generation, transmission and distribution industries. In addition, multiple targets may be aligned to provide even extended deposition zones, further improving throughput.

While attempts have been reported regarding use reactive sputtering in the context of textured substrates such as RABiT substrates, reactive sputtering in the context of such substrates is not useful for non-textured substrates due to intrinsic issues with texture in the as-deposited film. In addition, it appears that the state of the art has reported but not fully taught techniques for using reactive sputtering in textured substrate applications.

Additionally, use of a gridless ion assist source has numerous impacts on processing. While generally gridded ion assist sources have been utilized in the fabrication of biaxially textured buffer films, non-gridded source or sources according to embodiments herein can be used for long-length deposition zones. According to a particular feature, use of a gridless ion assist source helps facilitate implementation of a magnetron source to replace conventional ion beam sputter sources for IBAD. Gridless ion assist sources can operate at relatively high operating pressures, on the order of $10^{-1}$ to $10^{-4}$ torr, such as $10^{-2}$ to $10^{-3}$ torr, which are compatible pressures with magnetron sputtering.

Typically, the ion assist source 32 is capable of generating a collimated or non-diffused ion beam at power levels greater than about 250 eV. Here, the gridless ion source accelerates ions from a region of ion production through an electric field established within the bulk of a discharge area near an anode within the gridless ion source, as opposed to gridded ion sources that utilize an electrostatic ion acceleration optic to accelerate ions from a low pressure gas discharge. As such, the gridless ion source functions at relatively high pressures as noted above. A particular form of the gridless ion source may be one of those commercially available from Applied Ion Tech, operating at voltages on the order of 1500 eV, having dimensions of about 15 centimeters by 150 centimeters or greater.

While the invention has been illustrated and described in connection with particular methods for forming superconductive devices, it is not intended to be limited to the details shown, since various modifications and substitutions can be made without departing in any way from the scope of the present invention. For example, additional or equivalent substituents can be provided and additional or equivalent production steps can be employed. As such, further modifications and equivalents of the invention herein disclosed may occur to persons skilled in the art using no more than routine experimentation, and all such modifications and equivalents are believed to be within the scope of the invention as defined by the following claims.

What is claimed is:

1. A method for producing a superconducting conductor, comprising:
   providing a substrate;
   depositing a buffer film to overlie the substrate by exposing the substrate extending along a deposition zone to a material plume from a target, the deposition zone having a length of at least 1.0 m, and the buffer film having a biaxial texture; and
   depositing a superconductor layer to overlie the buffer film.

2. The method of claim 1, wherein the buffer film has an out-of-plane crystallographic texture having a mosaic spread of not greater than 30°.

3. The method of claim 2, wherein the mosaic spread is represented by a full-width-at-half-maximum value of an x-ray diffraction peak obtained by a (001) polefigure measurement.

4. The method of claim 2, wherein the buffer film has an out-of-plane crystallographic texture having a mosaic spread of not greater than 20°.

5. The method of claim 4, wherein the buffer film has an out-of-plane crystallographic texture having a mosaic spread of not greater than 15°.

6. The method of claim 1, wherein the buffer film has an in-plane crystallographic texture having a mosaic spread of not greater than 30°.

7. The method of claim 1, wherein the buffer film comprises an oxide.

8. The method of claim 1, wherein the buffer film is selected from the group consisting of MgO, NiO, YSZ, $CeO_2$, $Y_2O_3$, $TiO_2$, $SnO_2$, $Mn_3O_4$, $Fe_3O_4$, $Cu_2O$, and $RE_2O_3$, wherein RE is a rare earth element.

9. The method of claim 1, wherein the substrate comprises a metal alloy.

10. The method of claim 9, wherein the metal alloy comprises a Ni-based alloy.

11. The method of claim 1, wherein the superconductor layer comprises a high temperature superconductor material, having a critical temperature $T_c$ not less than about 77 K.

12. The method of claim 11, wherein the superconductor material comprises YBCO.

13. The method of claim 1, further comprising depositing a capping layer to overlie the superconductor layer.

14. The method of claim 13, further comprising depositing a stabilizer layer to overlie the capping layer.

15. The method of claim 1, wherein the length of the target corresponds to the length of the deposition zone.

16. The method of claim 1, wherein the length of the target is not less than 1.5 m.

17. The method of claim 16, wherein the length of the target is not less than 2.0 m.

18. The method of claim 1, wherein the target is rectangular.

19. The method of claim 1, wherein the buffer film is deposited by reactive magnetron sputtering.

20. The method of claim 19, wherein reactive magnetron sputtering is carried out by bombarding a metal target to form a plume that reacts to form the buffer film.

21. The method of claim 1, further comprising exposing the substrate to assist ions during deposition of the buffer film, the buffer film being deposited by ion beam assisted deposition incorporating reactive magnetron sputtering.

22. The method of claim 21, wherein the assist ions are generated from a gridless ion source.

23. The method of claim 1, wherein the substrate is non-textured.

24. A method for producing a superconducting conductor, comprising:

providing a non-textured substrate;

depositing a buffer layer to overlie the substrate by exposing the substrate along a deposition zone to a material plume generated by reactive sputtering, the deposition zone having a length of at least 1.0 m, and the buffer film having a biaxial texture;

exposing the substrate to a beam of assist ions generated from a gridless ion source during depositing, such that the buffer film has a biaxial texture having an out-of-plane crystallographic texture represented by a mosaic spread of not greater than 30°; and depositing a superconductor layer to overlie the buffer film.

* * * * *